(12) United States Patent
Norberg et al.

(10) Patent No.: US 9,431,791 B1
(45) Date of Patent: Aug. 30, 2016

(54) MULTI-SECTION HETEROGENEOUS SEMICONDUCTOR OPTICAL AMPLIFIER

(71) Applicant: Aurrion, Inc., Goleta, CA (US)

(72) Inventors: Erik Norberg, Santa Barbara, CA (US);
Brian R. Koch, San Carlos, CA (US);
Gregory Alan Fish, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 109 days.

(21) Appl. No.: 14/611,382

(22) Filed: Feb. 2, 2015

Related U.S. Application Data

(60) Provisional application No. 61/936,179, filed on Feb. 5, 2014.

(51) Int. Cl.
*H04J 14/02* (2006.01)
*H01S 5/042* (2006.01)
*H04B 10/25* (2013.01)

(52) U.S. Cl.
CPC .............. *H01S 5/042* (2013.01); *H04B 10/25* (2013.01); *H04J 14/02* (2013.01)

(58) Field of Classification Search
CPC ......... H01S 5/042; H04B 10/25; H04J 14/02
USPC .......................................................... 398/79
See application file for complete search history.

(56) References Cited

U.S. PATENT DOCUMENTS

| | | | | |
|---|---|---|---|---|
| 4,952,017 A * | 8/1990 | Henry | ................... | H01S 5/5009 257/622 |
| 5,151,818 A * | 9/1992 | Thijs | ................... | B82Y 20/00 257/432 |
| 6,175,446 B1 * | 1/2001 | Alphonse | ................... | B82Y 20/00 359/344 |
| 6,310,719 B1 * | 10/2001 | Goldstein | ............. | H01S 5/5009 359/344 |
| 6,487,007 B1 * | 11/2002 | Morito | .................. | H01S 5/5009 359/344 |
| 6,545,801 B2 * | 4/2003 | Morito | .................. | H01S 5/5009 257/18 |
| 6,671,086 B1 * | 12/2003 | Wang | .................... | B82Y 20/00 359/337.1 |
| 6,714,345 B2 * | 3/2004 | Traynor | ................ | H01S 5/5027 359/344 |
| 7,158,291 B2 * | 1/2007 | Saini | ..................... | H01S 5/2231 359/344 |
| 2001/0043390 A1 * | 11/2001 | Kim | ...................... | H01S 5/5018 359/344 |

OTHER PUBLICATIONS

Plant, "Improving the efficiency of high-power semiconductor optical amplifiers," in Proc. 2008 Conf. Lasers Electro-Opt., May 2008, pp. 1-2.*
Goldberg, "Broad-area high-power semiconductor optical amplifier," Appl. Phys. Lett., vol. 58, No. 13, pp. 1357-1359, Apr. 1, 1991.*
Cheung, Stanley, et al., "Theory and Design Optimization of Energy-Efficient Hydrophobic Wafer-Bonded III—V/Si Hybrid Semiconductor Optical Amplifiers", Journal of Lightwave Technology, v. 31, No. 24, (Dec. 15, 2013), pp. 4057-4066.
Raring, J. W., et al., "Demonstration of High Saturation Power/High Gain SOAs Using Quantum Well Intermixing Based Integration Platform", Electronic Letters, v. 41, Issue 24., (Nov. 24, 2005), pp. 1345-1346.

* cited by examiner

*Primary Examiner* — Juan A Torres

(74) *Attorney, Agent, or Firm* — Schwegman Lundberg & Woessner, P.A.

(57) ABSTRACT

Described herein are methods, systems, and apparatuses to utilize a semiconductor optical amplifier (SOA) comprising a silicon layer including a silicon waveguide, a non-silicon layer disposed on the silicon layer and including a non-silicon waveguide, first and second mode transition region comprising tapers in the silicon waveguide and/or the non-silicon waveguide for exchanging light between the waveguide, and a plurality of regions disposed between the first and second mode transition regions comprising different cross-sectional areas of the silicon waveguide and the non-silicon waveguide such that confinement factors for the non-silicon waveguide in each of the plurality of regions differ.

20 Claims, 6 Drawing Sheets

US 9,431,791 B1

MULTI-SECTION HETEROGENEOUS SEMICONDUCTOR OPTICAL AMPLIFIER

CROSS-REFERENCE TO RELATED APPLICATIONS

This application claims the benefit of priority to U.S. Provisional Patent Application entitled "MULTI-SECTION HETEROGENOUS INTEGRATED SEMICONDUCTOR OPTICAL AMPLIFIER," Ser. No. 61/936,179, filed Feb. 5, 2014, which is hereby incorporated herein by reference in its entirety.

FIELD

Embodiments generally pertain to optical devices and more specifically to semiconductor optical amplifiers.

BACKGROUND

In optical communication systems, transmission loss from optical fibers or insertion loss from optical components can occur. Devices such as semiconductor optical amplifiers (SOAs) can compensate for this attenuation within a system, particularity SOAs having low noise and high gain. However, SOAs can experience gain saturation, wherein the optical gain decreases with increasing optical output from the SOA, potentially affecting the quality of the output signal.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

Descriptions of certain details and implementations follow, including a description of the figures, which may depict some or all of the embodiments described below, as well as a description of other potential embodiments or implementations of the concepts presented herein. An overview of embodiments is provided below, followed by a more detailed description with reference to the drawings.

DESCRIPTION

Embodiments of the disclosure describe multi-section heterogeneous semiconductor optical amplifiers (SOAs). Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the disclosure.

Figure 1A:
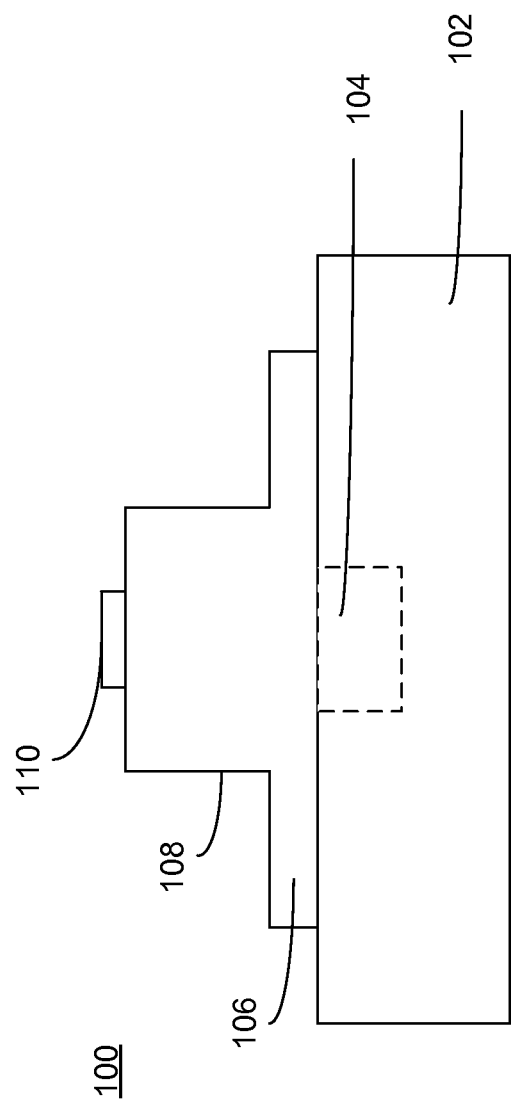
FIG. 1A is an illustration of a semiconductor optical amplifier (SOA) according to an embodiment of the disclosure.

FIG. 1A is an illustration of an SOA according to an embodiment of the disclosure. In this embodiment, an SOA 100 is illustrated (in a cross-section view) as a heterogeneous SOA comprising a silicon-on-insulator (SOI) region 102, a III-V semiconductor region 106 including a ridge waveguide 108, and an electrical contact 110. The III-V semiconductor waveguide 108 is shown to comprise a ridge waveguide. The waveguide of the SOA 100 comprises both the silicon waveguide 104 of the SOI region 102 and the III-V semiconductor ridge waveguide 108. As described in further detail below, light is input and output via the silicon waveguide 104, and is amplified via the III-V semiconductor waveguide 108, which is controlled, in part, by electrical current input via electrical contact 110—i.e., the optical gain obtained via the quantum well layer(s) of the III-V semiconductor waveguide 108 is controlled by current injection via the electrical contact 110.

SOAs can suffer from signal impairment if the optical power approaches the saturation power of the SOA. Prior art designs for SOAs implement a single confinement factor within the SOA gain region, and thus these SOAs have either allow for high gain (and thus, high confinement and low saturation power) or high saturation power (and thus, low confinement and low gain).

A more optimal SOA as described herein is designed to vary the confinement factor at least towards the SOA input and output. At the SOA input, wherein the strength of the input optical signal is low, the confinement factor can be high to allow for high gain (and low saturation). At the SOA output where the strength of the optical signal is higher, the confinement factor can be low to allow for high saturation (and low gain).

Figure 1B:
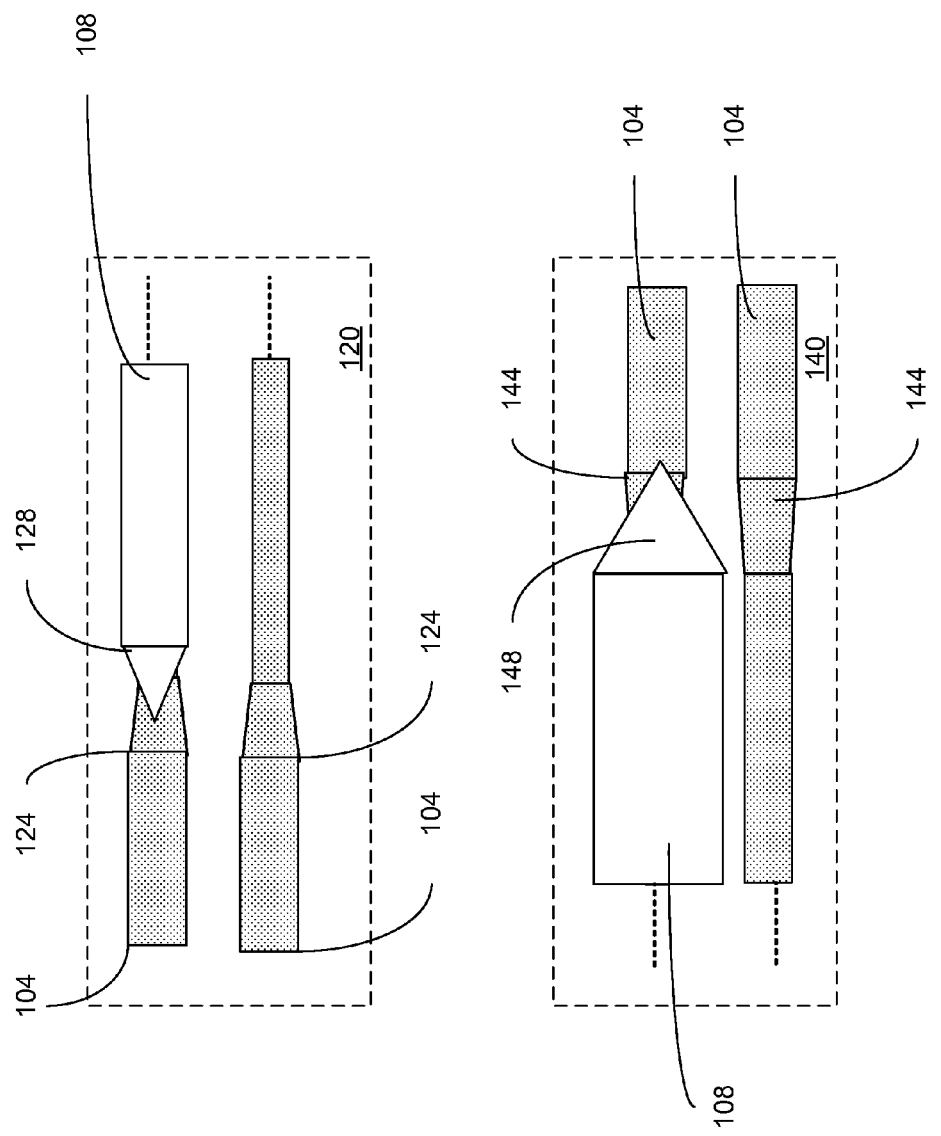
FIG. 1B is an illustration of regions of an SOA having different confinement factors.

FIG. 1B is an illustration of regions of the SOA 100 having different confinement factors. FIG. 1B illustrates an input region 120, wherein an optical signal is received via the silicon waveguide 104. In this embodiment, the III-V waveguide 108 and the silicon waveguide 104 in the input region 120 each include tapers—tapers 128 and 124, respectively, to allow for the input optical signal to transition from the silicon waveguide 104 to the III-V waveguide 108. FIG. 1B also illustrates an output region 140, wherein the III-V waveguide 108 and the silicon waveguide 104 each include tapers—tapers 148 and 144, respectively, to allow for the optical signal to transition from the III-V waveguide 108 to the silicon waveguide 104.

In this embodiment, the input region 120 of the SOA 100 has a high, efficient gain and a higher optical confinement factor. This may be achieved, for example, by utilizing a narrower III-V ridge for the III-V waveguide 108 included in this ridge, and also by altering the cross sectional area of the silicon waveguide 104 to increase the confinement factor of the (quantum well) of the III-V waveguide 108 in the input region 120. As the optical power is amplified along the SOA 100, subsequent sections, such as the output region 140, comprise a higher saturation power (but lower gain) in order to avoid the saturation effect; this may be achieved, for example, by utilizing a wider III-V ridge for the III-V section 108, and also altering the cross sectional area of the silicon waveguide 104 to decrease the confinement factor of the (quantum well) of the III-V section 108 in the input region 120. This allows for the SOA 100 to consume less overall power (i.e., less input electrical power for the same output power) and avoids saturating the SOA 100.

Embodiments of the invention describe a multi-section SOA on a heterogeneous platform, in which the optical confinement and/or III-V ridge width is varied along the SOA; in some embodiments, aspects of the silicon waveguide disposed beneath the III-V ridge vary in order to change the confinement factor of a particular SOA region. Saturation power, modal gain, and material gain are parameters that determine the light output of an SOA region. An SOA region with a large saturation power is capable of outputting light having a high power value because it is difficult for gain saturation to occur even when the power of the light input to said region is amplified. The following equations (Eq. 1-Eq. 3) describe how saturation power, modal gain, and material gain can be determined:

$$Ps=(wdh\nu)/(a\Gamma\tau),\qquad\text{Eq1.}$$

w=III-V ridge width, Γ=optical confinement factor, h=plank constant, v=frequency of light, d=thickness of active region, τ=carrier lifetime, a=differential gain.

$$G=(\Gamma g),\qquad\text{Eq.2}$$

G is modal gain (alternatively referred to herein as simply "gain"), g is material gain.

$$g=go*\ln(I/(wlJtr)),\qquad\text{Eq3.}$$

w=III-V ridge width, l=length of III-V ridge being pumped, I=current into SOA, Jtr=transparency terminal current, go=gain fit parameter. This assumes log fit of the material gain curve.

One effect of changing optical confinement factor is to tune the inherent trade off of high gain or high saturation power. This allows for a SOA with overall less power consumption (less input electrical power, for the same output power) and avoids saturating the SOA.

Figure 2A:
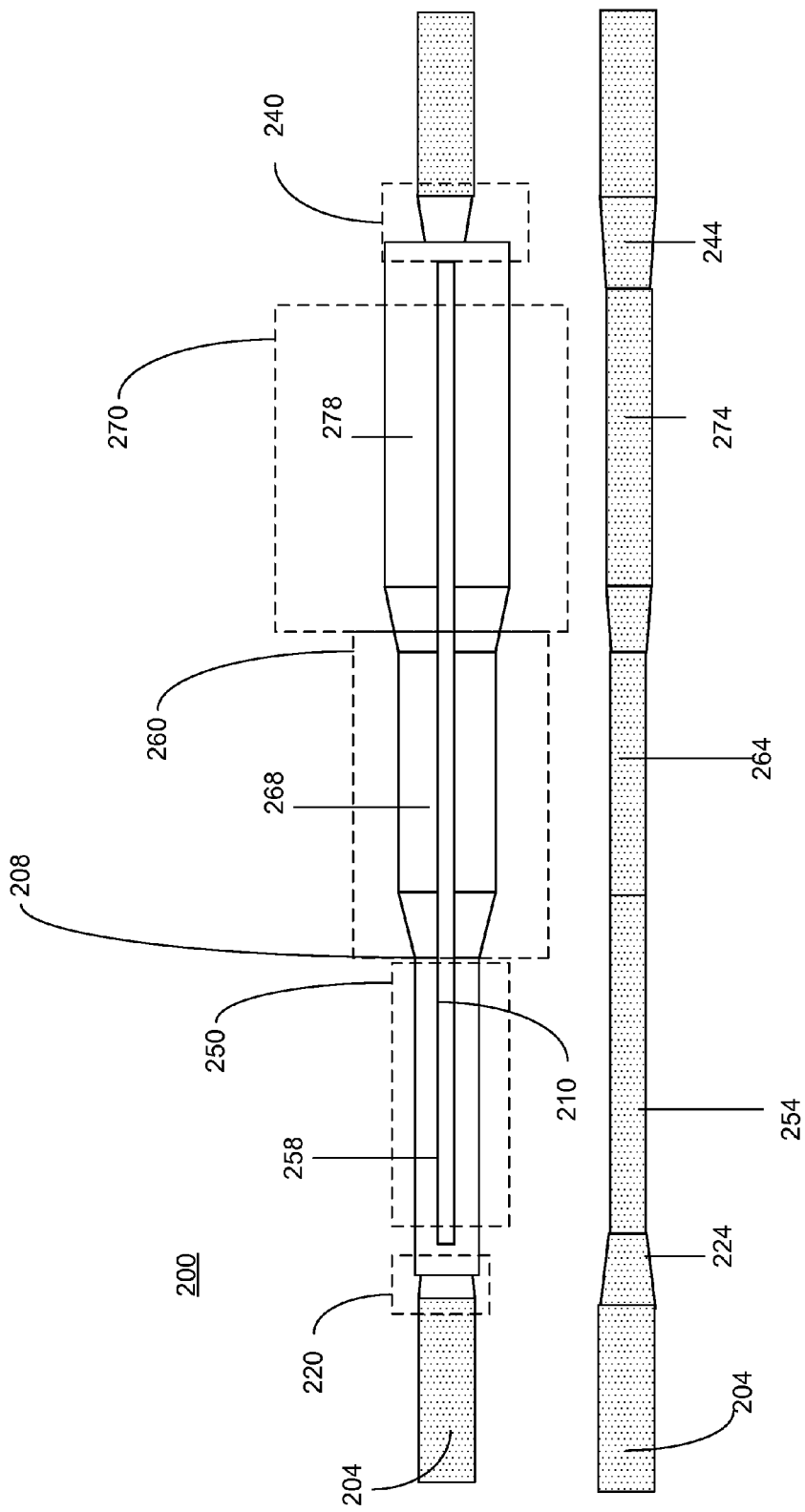
FIG. 2A-FIG. 2B are illustrations of a multi-section heterogeneous SOAs according to embodiments of the disclosure.
Figure 2B:
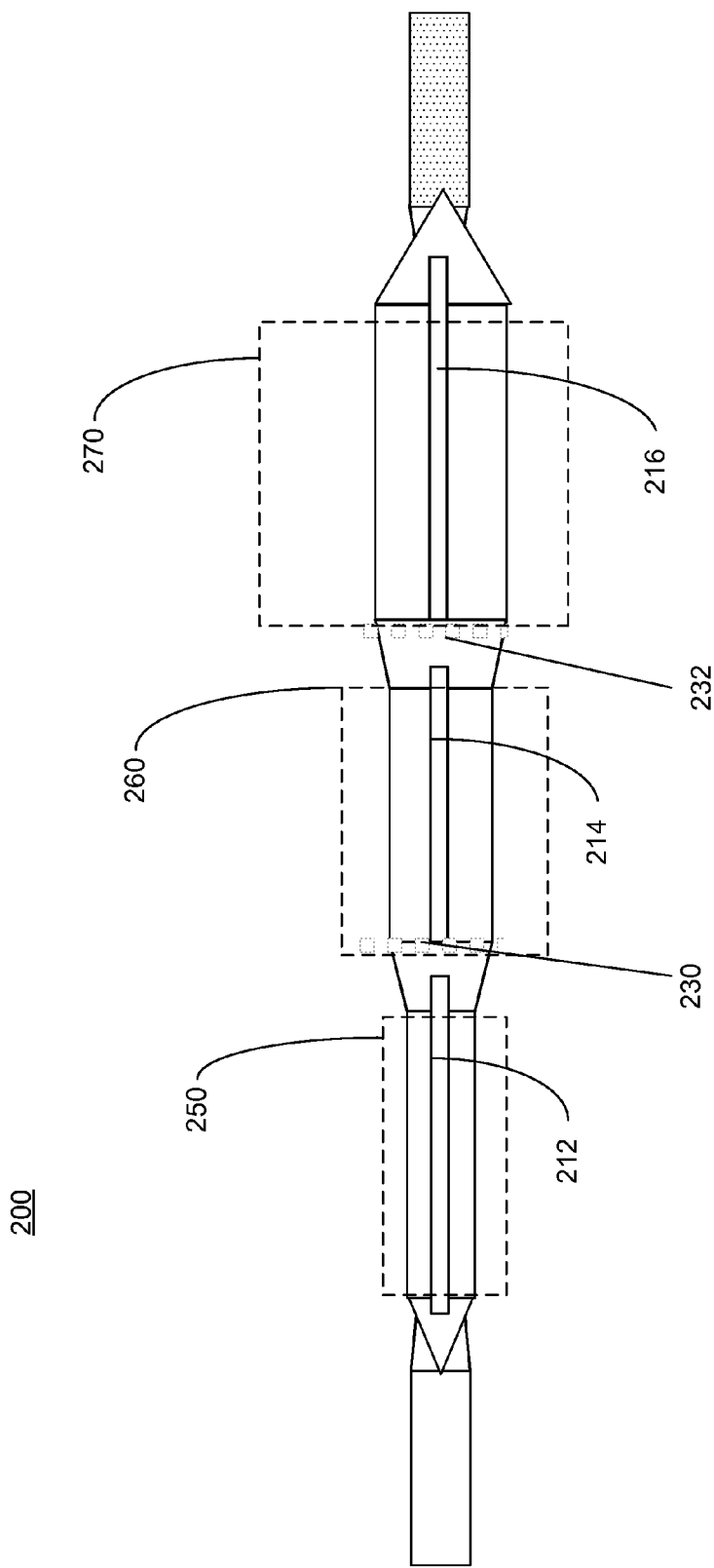

FIG. 2A-FIG. 2B are illustrations of a multi-section heterogeneous SOAs according to embodiments of the disclosure. In the embodiment illustrated in FIG. 2A, an SOA 200 is shown to include a III-V waveguide 208 (e.g., a ridge waveguide) disposed on a silicon waveguide 204. The SOA 200 includes an input region 220 wherein at least the silicon waveguide 204 includes a taper 224 to allow for the input optical signal to transition from the silicon waveguide 204 to the III-V waveguide 208. The SOA 200 also includes an output region 240, at least the silicon waveguide 204 includes a taper 244 to allow for the optical signal to transition from the III-V waveguide 208 to the silicon waveguide 204.

In this embodiment, the SOA 200 further includes multiple sections (shown as sections 250, 260, and 270) wherein the III-V waveguide 208 and the silicon waveguide 204 comprise different effective cross sections (e.g., varying widths, heights, processing features, etc.) such that each section has a different optical confinement factor for the section's III-V region.

In this example, the region 250 of the SOA 200 has a high/efficient gain due to aspects of the section 258 of the III-V waveguide 208 and aspects of the section 254 of the silicon waveguide 204. For example, in one embodiment, the width of the section 254 of the III-V waveguide 208 can be narrow such that the gain for the section increases (see Eq(3)), while the width of section 254 of the silicon waveguide 204 can be narrow to change the confinement factor in the quantum well of the section 254 of the III-V waveguide 208, and to ensure that the optical mode of the waveguide of the SOA 200 at this region is confined mostly to the III-V waveguide 208. In other embodiments, the aspects of the silicon waveguide 204 to "narrow" section 254 can comprise adjusting the height of the silicon, the inclusion of processing features to affect the mode of the silicon waveguide 204 (e.g., ridges formed to optically narrow the waveguide), etc.

As the optical power is amplified along the SOA 200, latter sections have wider III-V ridges and/or smaller optical confinement factors resulting in higher saturation power in order to avoid the saturation effect; while increasing the saturation power in these regions correspondingly lowers the gain, the optical signal is sufficiently amplified from the region 250 to offset the decrease in gain in subsequent regions. Thus, the region 260 of the SOA 200 in this embodiment comprises a higher saturation power and lower gain compared to region 250 due to the changes in the dimensions (or other features) of section 268 of the III-V waveguide 208 and section 264 of the silicon waveguide 204. Similarly, the region 270 of the SOA 200 in this embodiment comprises a higher saturation power and lower gain compared to region 260 due to the changes in the dimensions (or other features) of section 278 of the III-V waveguide 208 and section 274 of the silicon waveguide 204.

While the SOA 200 is shown to comprise multiple sections of varying optical confinement, the embodiment illustrated in FIG. 2A illustrates a single electrical contact 210 to control current injection for all of the regions 250, 260, and 270. Utilizing the single electrical contact 210 for the SOA 200 simplifies the control and the design of the SOA 200.

FIG. 2B illustrates an alternative electrical control configuration for the SOA 200, wherein each of the SOA regions 250, 260, and 270 is controlled by separate electrical contacts (i.e., the electrical contacts 212, 214, and 216, respectively). Electronic isolation regions 230 and 232 ensure each of the electrical contacts 212-216 are electronically isolated from one another. Utilizing the multiple electrical contacts 212-216 allows for more control of the gain for the regions 250, 260, and 270 (as described by Eq. (3)), and thus can be used to separately optimize the ratio between the optical signal power and the saturation power in any of the SOA regions 250, 260, and 270.

Figure 3:
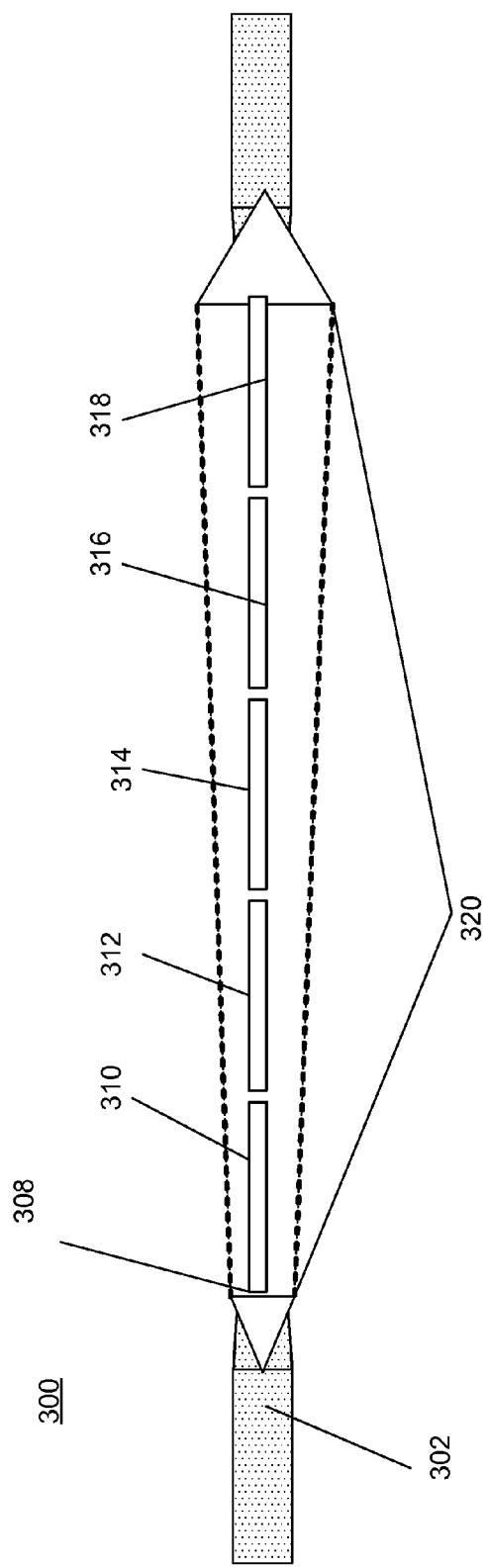
FIG. 3 is an illustration of a heterogeneous SOA according to an embodiment of the disclosure.

FIG. 3 is an illustration of a heterogeneous SOA according to an embodiment of the disclosure. In this embodiment, SOA 300 utilizes a plurality of electrical contacts 310-318 to enable the injection of various electrical currents into the III-V waveguide 308. A region 320 of the SOA 300 is shown to include a plurality of varying cross-sections (e.g., cross-sections of different widths of the III-V waveguide 308 and the silicon region 304). In this embodiment, the number of regions of the SOA 300 with varying cross-sections is extremely large; as the number of differing cross sections in the SOA 300 approaches infinity, the dimensions of the silicon waveguide 302 and the III-V waveguide 308 can be continuously changing along the SOA 200.

Embodiments of the invention thus describe heterogeneous SOA designs with larger saturation power, higher efficiency and smaller footprints. Numerous SOA designs, such as those described above, are feasible due to the effect of using both the Si and III-V waveguide cross section variations as design parameters.

Figure 4:
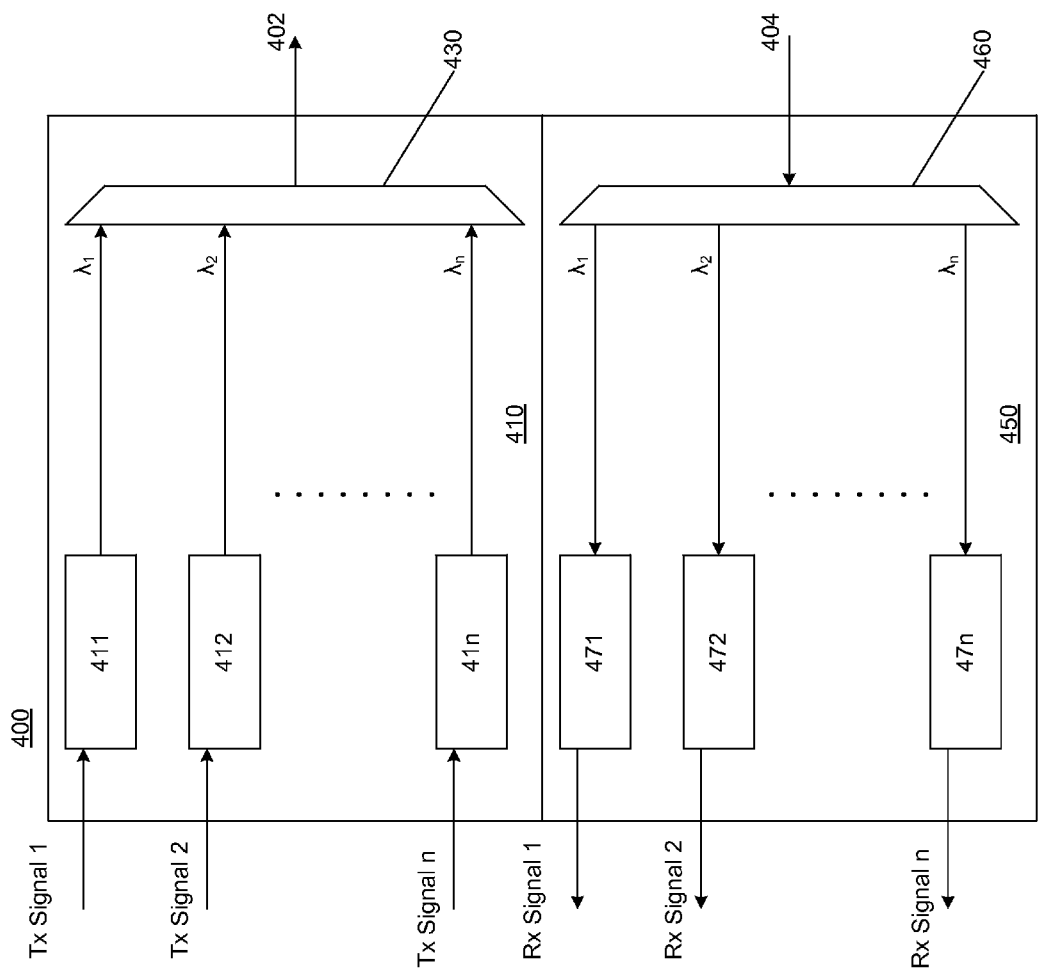
FIG. 4 illustrates a tunable multi-wavelength optical transceiver to utilize one or more SOAs according to an embodiment of the disclosure.

FIG. 4 illustrates a tunable multi-wavelength optical transceiver to utilize one or more SOAs according to an embodiment of the disclosure. In this embodiment, a transceiver 400 includes a transmitter module 410 for generating an output WDM signal 402 having n different WDM wavelengths. These different WDM wavelengths can be based, for example, on, the L, C and S bands for WDM applications. The transmitter module 400 includes tunable laser modules 411-41n to generate light, which can be further modulated based on transmission signal data. Said laser modules and modulators can be integrated or discrete components (not shown). A multiplexer 430 is shown to receive n modulated signals and outputs a WDM output signal 402 that comprises multiple output channels within a WDM spectral band.

The transceiver 400 further includes a receiver module 450 including a de-multiplexer 460 to receive a WDM input signal 404 and output the received signal at different WDM wavelengths along n different optical paths. It is to be understood that in other embodiments, the transmitter module 410 and the receiver module 450 can be included in separate devices (i.e., a separate transmitter and receiver). In this embodiment, optical detectors 471-47n are included in the n optical paths and convert the de-multiplexed signals of the WDM input signal 404 into n reception data signals for further processing.

In this embodiment, to compensate for insertion loss of optical components such as the multiplexer 430 and the de-multiplexer 460, optical signal loss from interconnecting optical fibers, etc., one or more heterogeneous SOAs as described above may be utilized to amplify various optical signals. These SOAs are designed to vary the confinement factor at least towards the SOA input and output; at the SOA input, wherein the strength of the input optical signal is low, the confinement factor can be high to allow for high gain (and low saturation). At the SOA output where the strength of the optical signal is higher, the confinement factor can be low to allow for high saturation (and low gain).

Reference throughout the foregoing specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures, or characteristics can be combined in any suitable manner in one or more embodiments. In addition, it is to be appreciated that the figures provided are for explanation purposes to persons ordinarily skilled in the art and that the drawings are not necessarily drawn to scale. It is to be understood that the various regions, layers, and structures represented in the figures can vary in size and dimensions.

The above described embodiments can comprise silicon on insulator (SOI) or silicon-based (e.g., silicon nitride (SiN)) devices, or can comprise devices formed from both silicon and a non-silicon material. Said non-silicon material (alternatively referred to as "heterogeneous material") can comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials can be significantly higher than in silicon-based materials, as electron speed in III-V semiconductors is much faster than that in silicon semiconductors. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in heterogeneous optical devices; in some embodiments, said heterogeneous devices utilize low-loss heterogeneous optical waveguide transitions between the devices' heterogeneous and silicon-only waveguides.

Magneto-optic materials allow heterogeneous PICs to operate based on the magneto-optic (MO) effect. Such devices can utilize the Faraday effect, in which the magnetic field associated with an electrical signal modulates an optical beam, offering high bandwidth modulation, and rotates the electric field of the optical mode, enabling optical isolators. Said magneto-optic materials can comprise, for example, materials such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials can comprise, for example, lithium niobate ($LiNbO_3$) or lithium tantalate ($LiTaO_3$).

In the foregoing detailed description, the method and apparatus of the present subject matter have been described with reference to specific exemplary embodiments thereof. It will, however, be evident that various modifications and changes can be made thereto without departing from the broader spirit and scope of the present disclosed subject matter. The present specification and figures are accordingly to be regarded as illustrative rather than restrictive.

Embodiments of the disclosure describe an SOA comprising a silicon layer comprising silicon semiconductor material and including a silicon waveguide, a non-silicon layer comprising non-silicon semiconductor gain material and disposed on the silicon layer and including a non-silicon waveguide, a first mode transition region comprising tapers in at least one of the silicon waveguide and/or the non-silicon waveguide to couple light from the silicon waveguide to the non-silicon waveguide, a second mode transition region comprising tapers in at least one of the silicon waveguide and/or the non-silicon waveguide to couple light from the non-silicon waveguide to the silicon waveguide, a plurality of regions disposed between the first and second mode transition regions comprising different cross-sectional areas of the silicon waveguide or the non-silicon waveguide such that confinement factor for the non-silicon waveguide in at least one of the plurality of regions differ, and at least one set of electrical contacts to inject current into the non-silicon waveguide material.

In some embodiments, the plurality of regions disposed between the first and second mode transition regions comprising different cross-sectional areas of the silicon waveguide and the non-silicon waveguide further includes a first region disposed towards the first mode transition region and comprising a first confinement factor for the non-silicon waveguide, and a second region disposed towards the second mode transition region and comprising a second confinement factor for the non-silicon waveguide, wherein the first confinement factor is larger than the second confinement factor. In some embodiments, the plurality of regions disposed between the first and second mode transition regions comprising different cross-sectional areas of the silicon waveguide and the non-silicon waveguide further includes a third region disposed between the first and second regions and comprising a third confinement factor for the non-silicon waveguide smaller than the first confinement factor and larger than the second confinement factor. In some embodiments, the first, second, and third regions are included separate tapered regions of the non-silicon waveguide. In some embodiments, the non-silicon waveguide comprises a single taper including the first, second, and third regions.

In some embodiments, the at least one set of electrical contacts comprises a plurality of sets of electrical contacts, each corresponding to one of the plurality of regions disposed between the first and second mode transition regions comprising different cross-sectional areas of the silicon waveguide and the non-silicon waveguide. In some embodiments, at least one of the plurality of sets of electrical contacts are to inject different current densities into the non-silicon waveguide material. In some embodiments, the at least one set of electrical contacts comprises a single set of electrical contacts.

In some embodiments, the plurality of regions disposed between the first and second mode transition regions comprising different cross-sectional areas of the silicon waveguide and the non-silicon waveguide comprise at least one of different widths and/or heights of the silicon layer and/or the non-silicon layer. In some embodiments, the plurality of regions disposed between the first and second mode transition regions comprising different cross-sectional areas of the silicon waveguide and the non-silicon waveguide comprise processing features included in the silicon layer to alter the optical mode of the silicon waveguide.

Embodiments of the disclosure describe a WDM receiving component comprising an SOA to receive and amplify an optical signal comprising a plurality of wavelengths, a (de)multiplexer to receive an amplified optical signal from the SOA and to output a separate optical signal for each of the plurality of wavelengths, and a plurality of optical receiver modules each receiving one of the optical signals from the de-multiplexer. Said SOA may comprise any of the SOAs described above.

The invention claimed is:

1. A semiconductor optical amplifier (SOA) comprising:
  a silicon layer comprising silicon semiconductor material and including a silicon waveguide;
  a non-silicon layer comprising non-silicon semiconductor gain material and disposed on the silicon layer and including a non-silicon waveguide;
  a first mode transition region comprising tapers in at least one of the silicon waveguide and/or the non-silicon waveguide to couple light from the silicon waveguide to the non-silicon waveguide;
  a second mode transition region comprising tapers in at least one of the silicon waveguide and/or the non-silicon waveguide to couple light from the non-silicon waveguide to the silicon waveguide;
  a plurality of regions disposed between the first and second mode transition regions comprising different cross-sectional areas of the silicon waveguide or the non-silicon waveguide such that confinement factor for the non-silicon waveguide in at least one of the plurality of regions differ; and
  at least one set of electrical contacts to inject current into the non-silicon waveguide material.

2. The SOA of claim 1, wherein the plurality of regions disposed between the first and second mode transition regions comprising different cross-sectional areas of the silicon waveguide and the non-silicon waveguide further includes:
  a first region disposed towards the first mode transition region and comprising a first confinement factor for the non-silicon waveguide; and
  a second region disposed towards the second mode transition region and comprising a second confinement factor for the non-silicon waveguide, wherein the first confinement factor is larger than the second confinement factor.

3. The SOA of claim 1, wherein the at least one set of electrical contacts comprises a plurality of sets of electrical contacts, each corresponding to one of the plurality of regions disposed between the first and second mode transition regions comprising different cross-sectional areas of the silicon waveguide and the non-silicon waveguide.

4. The SOA of claim 1, wherein the at least one set of electrical contacts comprises a single set of electrical contacts.

5. The SOA of claim 1, wherein the plurality of regions disposed between the first and second mode transition regions comprising different cross-sectional areas of the silicon waveguide and the non-silicon waveguide comprise at least one of different widths and/or heights of the silicon layer and/or the non-silicon layer.

6. The SOA of claim 1, wherein the plurality of regions disposed between the first and second mode transition regions comprising different cross-sectional areas of the silicon waveguide and the non-silicon waveguide comprise processing features included in the silicon layer to alter the optical mode of the silicon waveguide.

7. The SOA of claim 2, wherein the plurality of regions disposed between the first and second mode transition regions comprising different cross-sectional areas of the silicon waveguide and the non-silicon waveguide further includes:
  a third region disposed between the first and second regions and comprising a third confinement factor for the non-silicon waveguide smaller than the first confinement factor and larger than the second confinement factor.

8. The SOA of claim 3, wherein at least one of the plurality of sets of electrical contacts are to inject different current densities into the non-silicon waveguide material.

9. The SOA of claim 7, wherein the first, second, and third regions are included separate tapered regions of the non-silicon waveguide.

10. The SOA of claim 7, wherein the non-silicon waveguide comprises a single taper including the first, second, and third regions.

11. A wavelength division multiplexing (WDM) receiving component comprising:
  a semiconductor optical amplifier (SOA) to receive and amplify an optical signal comprising a plurality of wavelengths, the SOA comprising:
    a silicon layer comprising silicon semiconductor material and including a silicon waveguide;
    a non-silicon layer comprising non-silicon semiconductor gain material and disposed on the silicon layer and including a non-silicon waveguide;

a first mode transition region comprising tapers in at least one of the silicon waveguide and/or the non-silicon waveguide to couple light from the silicon waveguide to the non-silicon waveguide;

a second mode transition region comprising tapers in at least one of the silicon waveguide and/or the non-silicon waveguide to couple light from the non-silicon waveguide to the silicon waveguide;

a plurality of regions disposed between the first and second mode transition regions comprising different cross-sectional areas of the silicon waveguide or the non-silicon waveguide such that confinement factor for the non-silicon waveguide in at least one of the plurality of regions differ; and at least one set of electrical contacts to inject current into the non-silicon waveguide material;

a (de)multiplexer to receive an amplified optical signal from the SOA and to output a separate optical signal for each of the plurality of wavelengths; and a plurality of optical receiver modules each receiving one of the optical signals from the de-multiplexer.

12. The WDM receiving component of claim 11, wherein the plurality of regions of the SOA disposed between the first and second mode transition regions comprising different cross-sectional areas of the silicon waveguide and the non-silicon waveguide further includes:

a first region disposed towards the first mode transition region and comprising a first confinement factor for the non-silicon waveguide; and a second region disposed towards the second mode transition region and comprising a second confinement factor for the non-silicon waveguide, wherein the first confinement factor is larger than the second confinement factor.

13. The WDM receiving component of claim 11, wherein the at least one set of electrical contacts of the SOA comprises a plurality of sets of electrical contacts, each corresponding to one of the plurality of regions disposed between the first and second mode transition regions comprising different cross-sectional areas of the silicon waveguide and the non-silicon waveguide.

14. The WDM receiving component of claim 11, wherein the at least one set of electrical contacts of the SOA comprises a single set of electrical contacts.

15. The WDM receiving component of claim 11, wherein the plurality of regions of the SOA disposed between the first and second mode transition regions comprising different cross-sectional areas of the silicon waveguide and the non-silicon waveguide comprise at least one of different widths and/or heights of the silicon layer and/or the non-silicon layer.

16. The WDM receiving component of claim 11, wherein the plurality of regions of the SOA disposed between the first and second mode transition regions comprising different cross-sectional areas of the silicon waveguide and the non-silicon waveguide comprise processing features included in the silicon layer to alter the optical mode of the silicon waveguide.

17. The WDM receiving component of claim 12, wherein the plurality of regions of the SOA disposed between the first and second mode transition regions comprising different cross-sectional areas of the silicon waveguide and the non-silicon waveguide further includes:

a third region disposed between the first and second regions and comprising a third confinement factor for the non-silicon waveguide smaller than the first confinement factor and larger than the second confinement factor.

18. The WDM receiving component of claim 13, wherein at least one of the plurality of sets of electrical contacts are to inject different current densities into the non-silicon waveguide material.

19. The WDM receiving component of claim 17, wherein the first, second, and third regions are included separate tapered regions of the non-silicon waveguide.

20. The WDM receiving component of claim 17, wherein the non-silicon waveguide comprises a single taper including the first, second, and third regions.

* * * * *